United States Patent [19]

Seiberras et al.

[11] Patent Number: 5,603,771
[45] Date of Patent: Feb. 18, 1997

[54] CHEMICAL VAPOR DEPOSITION APPARATUS ACTIVATED BY A MICROWAVE PLASMA

[75] Inventors: Ghislaine Seiberras, Fontenay Aux Roses; Claude Indrigo, Maisons Alfort; Remy Mevrel, Le Plessis Robinson; Philippe LePrince, Gif Sur Yvette; Michel Bejet, Les Ulis; Claude Le Pennec, Vincennes, all of France

[73] Assignee: Office National d'Etudes et de Recherches Aerospatiales, Chatillon Sous Bagneux, France

[21] Appl. No.: 403,780

[22] PCT Filed: Sep. 23, 1993

[86] PCT No.: PCT/FR93/00926

§ 371 Date: Mar. 23, 1995

§ 102(e) Date: Mar. 23, 1995

[87] PCT Pub. No.: WO94/06950

PCT Pub. Date: Mar. 31, 1994

[30] Foreign Application Priority Data

Sep. 24, 1992 [FR] France .................................. 92 11391

[51] Int. Cl.⁶ ................................................ C23C 16/00
[52] U.S. Cl. ........................... 118/723 ME; 118/723 MW
[58] Field of Search .......................... 118/726, 723 MW, 118/723 ME; 156/345; 204/298.38, 298.07

[56] References Cited

U.S. PATENT DOCUMENTS

| | | | |
|---|---|---|---|
| 5,007,372 | 4/1991 | Hattori et al. ........................ | 118/715 |
| 5,316,585 | 5/1994 | Okamoto et al. ........................ | 118/719 |
| 5,356,451 | 10/1994 | Cain et al. ........................ | 65/414 |
| 5,421,895 | 6/1995 | Tsubouchi et al. ........................ | 118/726 |
| 5,435,850 | 7/1995 | Rasmussen ........................ | 118/726 |
| 5,447,569 | 9/1995 | Hiskes et al. ........................ | 118/726 |
| 5,451,258 | 9/1995 | Hillman et al. ........................ | 118/715 |
| 5,462,014 | 10/1995 | Awaya et al. ........................ | 118/725 |
| 5,476,547 | 12/1995 | Mikoshiba et al. ........................ | 118/726 |
| 5,481,081 | 1/1996 | Ikegaya et al. ........................ | 219/121.48 |

*Primary Examiner*—R. Bruce Breneman
*Assistant Examiner*—Joni Y. Chang
*Attorney, Agent, or Firm*—Larson and Taylor

[57] ABSTRACT

Apparatus for plasma activated chemical vapor deposition, the apparatus comprising a microwave-excited plasma reactor with a reaction enclosure (10), a microwave generator (20), a waveguide (21) providing non-resonant coupling, and insertion means (40–54) for inserting at least one flow of a predetermined gaseous mixture into the enclosure; the insertion means comprise, in order: transformation means (40–43) for transforming the state of a precursor of a material to be deposited to bring it to the gaseous state, feed means (41, 42) for feeding a vector gas suitable for being charged with the gaseous precursor to constitute the above-mentioned predetermined gaseous mixture; and injection means (18) for injecting the predetermined gaseous mixture into the enclosure (10) and comprising an externally frustoconical nozzle provided with an injection orifice situated at one end and shaped as a function of the injection orifice and of the column configuration of the plasma formed, said nozzle having means for heating and thermally insulating the gaseous mixture.

11 Claims, 4 Drawing Sheets

CHEMICAL VAPOR DEPOSITION APPARATUS ACTIVATED BY A MICROWAVE PLASMA

BACKGROUND OF THE INVENTION

The present invention relates to the field of chemical vapor deposition with the assistance of a plasma, and more specifically, it relates to an apparatus for plasma activated chemical vapor deposition, the apparatus comprising, disposed one after another:

a plurality of transformation means for transforming the state of respective precursors of a plurality of deposition materials to cause each of them to pass from an initial state to the gaseous state;

a plurality of charging means for charging vector gases with respective gaseous precursors, each precursor-charged vector gas constituting a predetermined gaseous mixture;

a plurality of transfer means for transferring said predetermined gaseous mixtures to a plasma reactor having microwave excitation comprising a reaction enclosure, a microwave generator, and at least one waveguide interposed between said generator and the enclosure and providing non-resonant coupling; and injection means for injecting said predetermined gaseous mixtures into the reaction enclosure.

Apparatuses of the type to which the invention applies are designed to form deposits of special materials, in particular of ceramics, on substrates. It is thus possible, in particular, to make thermal barriers which, when deposited on an appropriate protective coating (e.g. of MCrAlY material), enable turbine blades to be made that are well protected thermally: the operating temperature of the metal portions remains below the allowed limit for the base material and the protective coating, while the temperature of the gas at the inlet of the turbine can be considerably hotter (50° C. to 100° C.), thereby correspondingly increasing the efficiency of the turbine.

At present, three methods are known for obtaining thermal barriers:

1. The most widely used technique is plasma spraying. Grains of partially-stabilized zirconia powder are inserted into a plasma jet; they melt therein and are accelerated so as to be projected at high speed against a facing substrate. They solidify thereon rapidly and they adhere thereto by mechanically engaging roughnesses previously formed on the surface of the part, generally by sandblasting. The resulting coatings have a flaky structure that results from the stacking up of droplets that have flattened and solidified in lens-shapes, with solidification being accompanied by microcracking. The highest performance deposits are constituted by a layer of zirconia partially stabilized by 6% to 8% by weight of yttria deposited on an underlayer of MCrAlY alloy (where M=Ni and/or Co and/or Fe), itself deposited by plasma spraying under a controlled atmosphere. Generally, the ceramic layers obtained in this way are about 300 μm thick. This technique leads to deposits having microcracks and that may be constituted by metastable phases, with deposition speeds being very high, of the order of 100 μm/min. It should nevertheless be observed that the method is directional and that parts of complex shapes are difficult or even impossible to cover. Furthermore, the roughness of such deposits makes finishing treatment necessary to achieve a surface state that is aerodynamically satisfactory.

2. The method of evaporation under electron bombardment makes use of an electron beam emitted by a heated filament. The beam is accelerated by application of an electric field and it is directed by means of a magnetic field onto the material to be evaporated, in the present case a bar of yttrium-containing zirconia. Under the effect of such electron bombardment, the species are evaporated and condensed on the substrate that is placed facing the source. The substrate is optionally biased and is preheated and/or heated during the deposition operation. The results obtained by implementing this method present certain advantages:

the roughness of the layer obtained in this way is better adapted to aerodynamic flow;

the column structure of the deposit improves its thermomechanical behavior;

it has higher resistance to erosion; and the layer adheres better.

However, it should be observed that making a coating of yttrium-containing zirconia at a high deposition speed (100 μm/h) requires high electrical power to evaporate the bar of refractory oxide. In addition, implementation of this technique requires considerable investment and a large amount of know-how. Furthermore, this method is likewise directional, i.e. parts that are complex can be difficult or even impossible to coat.

3. The radiofrequency cathode sputtering method makes it possible to deposit thin layers of yttrium-containing zirconia at low deposition speeds of the order of 1 μm/h. In this method, a material raised to a negative potential is subjected to bombardment by positive ions. The atoms of the material are ejected in all directions and condensed, in particular on the substrate placed facing it so as to have a deposit formed thereon. Systems have been used to make deposits of insulating materials (deposits of oxides in particular) with possible modifications (magnetron, spraying in a reactive atmosphere, etc.) in order to increase deposition speeds (up to a few μm/h). With this technique, it is certainly easier to control the composition of deposits than it is with the method of evaporation under electron bombardment; however deposition speeds are much slower and, as in the two preceding methods, deposition takes place directionally.

An essential object of the invention is to provide a novel deposition apparatus which enables the respective advantages of chemical vapor deposition and of plasma assistance to be combined, and in particular: a method which is non-directional, takes place at a lower temperature and at an increased deposition speed, and a deposit which has a structure that is controlled.

SUMMARY

To this end, a plasma activated chemical vapor deposition apparatus as defined in the above preamble is essentially characterized, when in accordance with the invention, in that the transfer means for transferring the respective predetermined gaseous mixtures are independent of one another, and in that the injection means include a nozzle of frustoconical external profile into which the above-mentioned independent transfer means open out and which is provided with at least one injection orifice, the end of said nozzle being shaped as a function of the desired configuration for the jet of ionized gas, said nozzle being fitted with means for heating and for thermally insulating the predetermined gaseous mixture.

DESCRIPTION OF PREFERRED EMBODIMENTS

If the precursor used is in the solid state or the liquid state, then advantageously provision is made for the transformation means for transforming the state of the precursor to comprise at least one chamber fitted with means for adjusting temperature and/or pressure to transform the precursor into the gaseous phase.

If the precursor is in the solid state, then it is desirable for the charging means for charging a vector gas with gaseous precursor to be organized so that the vector gas passes through the precursor in powder form.

The above-mentioned vector gas may either be neutral or else chemically reactive with the gaseous precursor.

Preferably, the transfer means for transferring the predetermined gaseous mixture include at least one transfer tube that is heated and/or thermally insulated, and at least one stop valve that is heated and/or thermally insulated. When a plurality of different predetermined gaseous mixtures need to be injected into the enclosure, provision may be made for a mixing chamber into which all of the respective transfer tubes for the different predetermined gaseous mixtures open out and which is disposed upstream from the injection orifice.

For injection proper into the reaction enclosure, the nozzle may be arranged in any manner appropriate to the looked-for results: it may be provided with a single outlet orifice, or it may be provided with a multiplicity of outlet orifices defined by subdivision means (such as a grid, a trellis, or a perforated plate) so as to ensure maximum ionization of the jet of gas in the form of a column bearing against the carrier of the sample to be coated that is disposed in the enclosure.

DETAILED DESCRIPTION OF THE EMBODIMENTS

Figure 1:
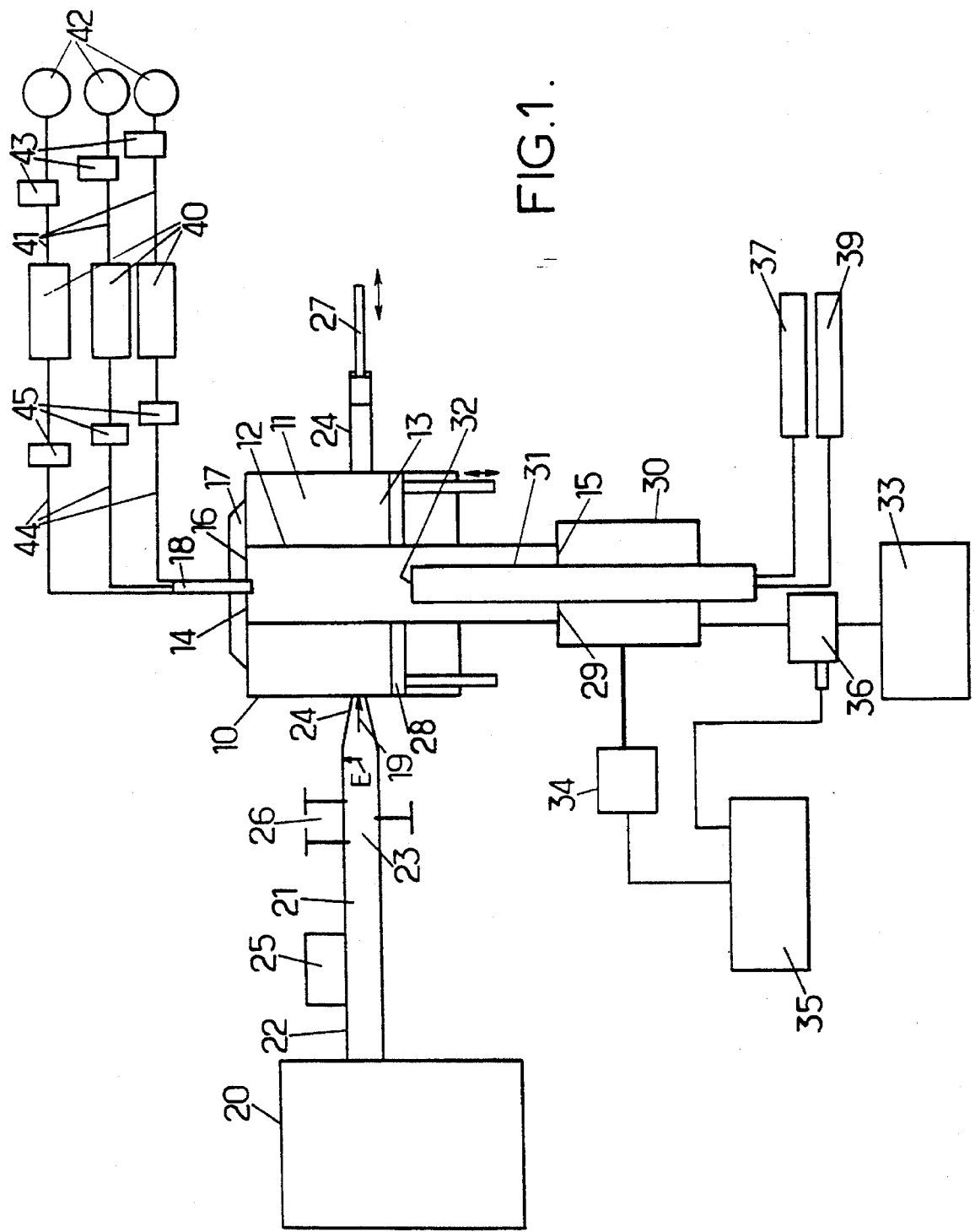
FIG. 1 is a diagrammatic overall view of the essential means implemented in the plasma activated vapor deposition apparatus of the invention.

With reference initially to FIG. 1, the microwave plasma activated chemical vapor deposition apparatus comprises a metal enclosure 10, e.g. made of brass, having a case that is generally rectangular or circular in shape.

The enclosure 10 includes an internal cylindrical tube 12 that is centered relative to the enclosure 10 and whose wall is made of a material that has low dielectric losses, such as quartz.

The tube 12 has a circular opening 14 at its upper end and a circular opening 15 at its lower end.

The top portion of the enclosure 10 includes a circular opening 16 centered relative to the enclosure 10 and of a diameter substantially equal to the diameter of the opening 14 of the tube 12. The circular opening 16 is fully closed by a circular metal cover 17 made of stainless steel, for example. The cover 17 is pierced at its center by an orifice allowing a tube 18 to pass therethrough, the end of the tube having a special geometrical shape (e.g. cylindrical, hemispherical, or frustoconical) and opening out into the tube 12.

The circular opening 15 of the bottom portion of the tube 12 communicates with the outside via another cylindrical opening 29 of diameter substantially equal to that of the opening 15 and formed in the cover of a metal box 30 made of stainless steel, for example, and on which the tube 12 stands.

The apparatus also includes a microwave generator 20 emitting at a frequency of about 2.45 GHz and at a power of 1.2 kW.

A waveguide 21 conveys the microwaves to the tube 12 by non-resonant coupling in which the tube 12 does not dissipate the microwave energy communicated thereto in the form of electromagnetic radiation when gas is present in said tube 12. The electromagnetic energy propagates along the waveguide 21 in its longitudinal direction (arrow 19), with the electric field E extending perpendicularly to the direction 19.

A bidirectional coupler 25 is provided in the initial portion of the waveguide 21. In its intermediate portion 23 of rectangular section, the waveguide includes a plurality of penetrating adjustment screws 26 enabling the impedance of the reactor to be matched so as to obtain good efficiency in the transmission of microwaves towards the tube 12. The terminal portion 24 of the waveguide becomes progressively thinner in the direction parallel to the field E and wider in the direction perpendicular to the field E so as to achieve a right cross-section that is flat, rectangular, and substantially equal to the width of the enclosure 10.

The intermediate portion of the enclosure 10 is subdivided into two half-enclosures 11 and 13 which are separated from each other by a space (or gap) of rectangular right cross-section equal to that of the terminal portion 24 of the waveguide. The space (or gap) formed in this way permits non-resonant coupling of the waveguide with the tube 12.

On its side diametrically opposite from the microwave feed 21, the tube is provided with non-resonant coupling. The non-resonant coupling is established by a piston-type short circuit 27 having a flat rectangular right cross-section substantially equal to that of the terminal portion of the waveguide 24. The position of the piston 27 is adjusted to define a desired microwave electric field in the tube 12.

Inside the enclosure 10, a second microwave short circuit 28 is provided that is coupled to the tube 12. The second short circuit 28 is constituted by an annular plate that is also of the piston type. The plasma originates in the tube 12 and it may be confined to a greater or lesser extent by adjusting the height of the annular plate 28.

The box 30 is generally circular in shape and it contains the sample carrier 31 which supports the part to be coated that is capable of being rotated (the part is not shown but it occupies the position referenced 32), with the sample carrier being placed coaxially inside the tube 12. The sample carrier 31 is movable in vertical translation, thereby enabling it to carry the part 32 out from or into the plasma that is produced in the tube 12.

The tube 12 and the box 30 are evacuated by primary pump means 33 (e.g. using Roots type pumps delivering about 125 cubic meters per hour) associated with a pressure gauge 34 that has an inlet connected to the box 30 and an outlet connected to a pressure controller 35. In response to the pressure measured by the gauge 34, the pressure controller 35 actuates a motor that opens or closes a valve 36 connected to the primary pump means 33 for the purpose of controlling the pressure in the enclosure.

Figure 2:
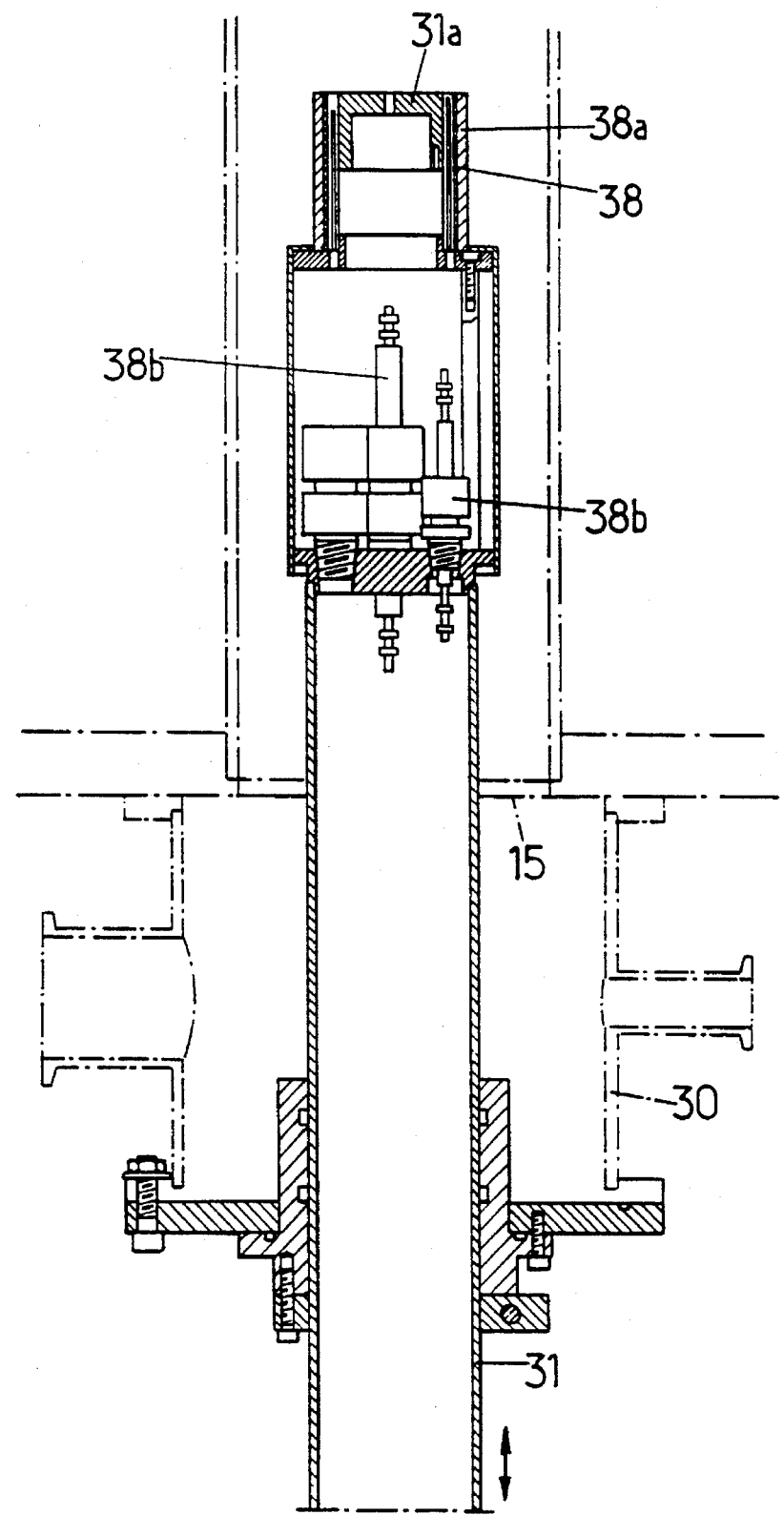
FIG. 2 is a cross-section through the sample carrier fitted with independent biasing and heating means, as used in the FIG. 1 apparatus.

With reference now to FIGS. 1 and 2 together, for the purpose of cleaning a surface prior to deposition, the apparatus of the invention includes DC generator means 37 suitable for establishing a DC bias between the gas flow inlet means 18 and the metal portion 31a, e.g. made of copper, of the sample carrier 31. Sometimes it is also necessary to heat the sample during such cleaning and/or while the deposit proper is being made. To this end, the apparatus further includes independent heating means 38 constituted by a coil of resistance wire disposed inside an alumina shell 38a. The heating system is regulated by means of an external unit 39 controlled by a probe placed near the position 32.

The connection established between the voltage and temperature control units 37 and 38 respectively with the biasing and heating elements 31a and 38 are provided via sealed passages 38b.

Figure 3:
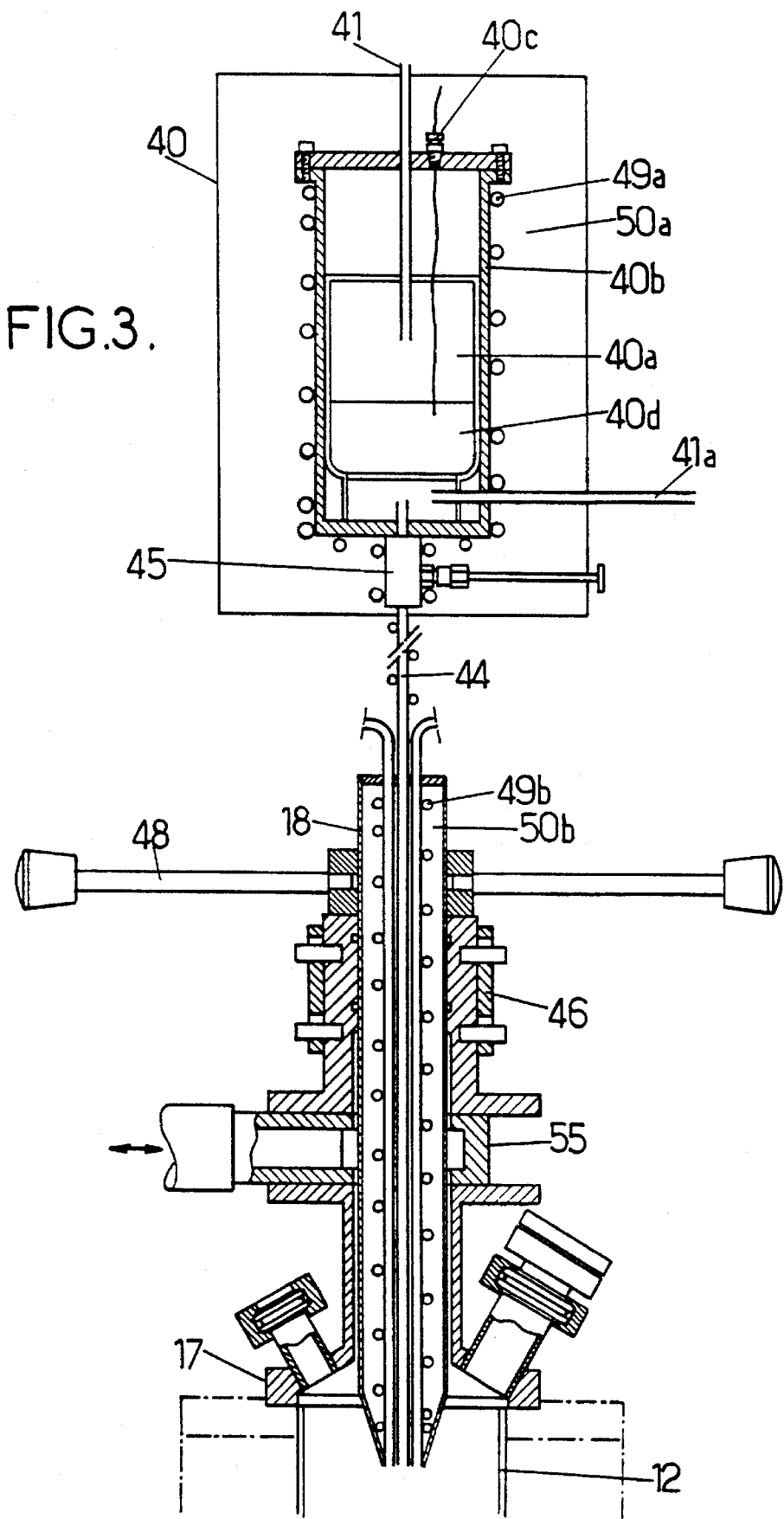
FIG. 3 is a cross-section view through the means for injecting into the reaction enclosure of the FIG. 1 apparatus.

With reference now to FIGS. 1 and 3, the apparatus of the invention includes means enabling gas to be fed via the tube 18 into the tube 12. The system for inserting precursors of the elements constituting the intended deposit is made up of two main zones having the following functions, respectively:

converting the precursor from its initial state to the gaseous state; and conveying the precursor in the gaseous state into the reaction enclosure 12.

The precursors of the elements that constitute the deposit may be solids, liquids, or gases. With solids, the precursors are placed in enclosures 40 in which they are transformed into gaseous form by the effects of temperature and/or pressure. These enclosures 40 include heating elements 49a and thermal insulation 50a, and they are connected upstream via conventional flexible or rigid tubes 41 to gas cylinders 42 that may contain either reagent gases or else inert gases. Control means 43 such as flowmeters and flow rate controllers enable the gas flow rate in the tubes to be controlled and regulated. The vector gases travel past the precursors (solid, liquid, or gaseous) and, downstream from the enclosures and once charged with gaseous precursors, they penetrate into tubes 44 adapted to conveying gaseous mixtures. The tubes 44 are conventional tubes, each being provided with a heater 49b and thermal insulation 50b. In addition, the tubes 44 are fitted with stop valves 45 that are heated 49a and thermally insulated 50a to enable the precursor to be isolated. It is thus possible at will either to return the precursor to the air or to keep it under the atmosphere of vector gas, depending on the risk of damage.

Figure 4A:
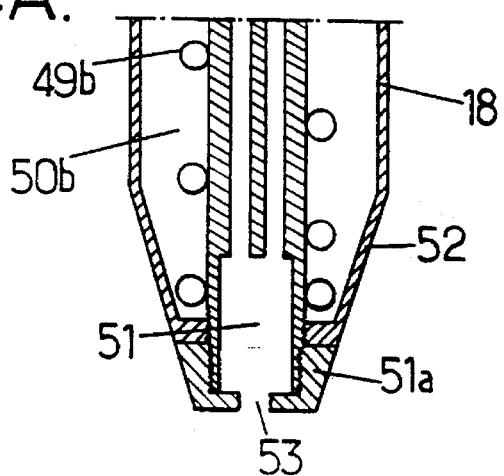
FIGS. 4A, 4B, and 4C show different shapes that can be adopted for the injection nozzle of the means of FIG. 3.
Figure 4B:
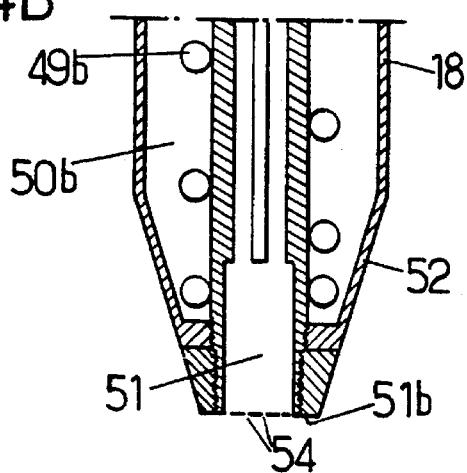
Figure 4C:
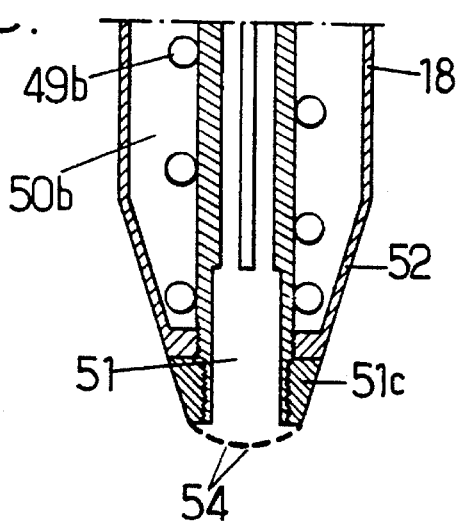

With reference to FIGS. 4A to 4C, the various precursors, all in gaseous form, may optionally be mixed in a mixing chamber 51 provided for this purpose in the injection nozzle 52, which nozzle is tapering in outside shape and terminates the tube 18 where it opens out into the tube 12.

The nozzle 52 is provided with a single orifice 53 (FIG. 4A) or else with multiple orifices 54 (FIGS. 4B and 4C), that are smaller than the section of the tube 18.

The terminal portion of the tube 18 has an original geometrical shape, i.e. a truncated cone into which the vector gases charged with gaseous precursors for making the deposit, either via a single orifice 51a or via a plurality of orifices which may be defined by a grid or a trellis 51b, for example (FIG. 4B), or else by a perforated plate in the form of a spherical cap 51c (FIG. 4C), which shape makes it possible to ensure maximum ionization of the gas jet in the form of a column bearing on the sample carrier. The width of said column is a function of the geometrical shape selected for the injection nozzle (it increases on going from a single orifice to multiple orifices).

By way of example, and with reference to FIGS. 1 and 3, the use of the apparatus of the invention is now described in the case of depositing a zirconium oxide. The metallic precursor is in the form of powder 40d and it is contained in a filtering crucible 40a made of quartz which is itself received in an enclosure 40b made of stainless steel. This enclosure is placed in an enclosure 40 that enables the powder to be heated by means of a system of heating collars 49a. The temperature of the enclosure 40 is regulated by means of an external unit that is controlled by a probe 40c placed in the powder. The oxygen, a reagent gas, is itself conveyed by means of a conventional tube 41a.

Argon, an inert gas, is inserted into the enclosure 40a by means of the tube 41. The powder heated under reduced pressure is converted to the form of a gas. The inert gas becomes charged with the gaseous precursor, passes through the powder, and is inserted into the enclosure 12 together with the oxygen via the tube 44. The tube 44 is heated by a system of heating cords that are coiled 49b and thermally insulated 50b, and the entire assembly is held in the tube 18. Handles 48 fixed on the tube 18 enable said tubes to be moved vertically. When in the high position, the stop valve 55 may be closed so as to isolate the precursor. The cover 17 and all the elements attached thereto may be moved in vertical translation by a lifting system 46.

The oxygen over argon flow rate ratio may vary in the range 2 to 10. Tests have been performed with pressures in the enclosure lying in the range 100 Pa to 1000 Pa. Coupling is adjusted by positioning the piston 27 and the matching screws 26. It has been possible to obtain a layer of column structure monoclinic zirconia at an average deposition speed of 100 μm/h on a substrate of MCrAlY alloy.

In general, the apparatus of the invention makes it possible to make any type of ceramic coating insofar as precursors exist or can be produced and are transportable in gaseous form. The ceramics may be made up of pure oxides ($SiO_2$, $Al_2O_3$, . . . ), combinations of oxides ($ZrO_2$ & $Y_2O_3$, $SiO_2$ & $GeO_2$, . . . ), metalloids (C, B, Si, . . . ), combinations of metalloids (SiC, $B_4C$, BN, . . . ), or indeed metalloid/metal combinations (TiC, $TiB_2$, AlN, . . . ).

An application of the apparatus lies in making thermal barriers of zirconia partially stabilized with yttria. Uses can be envisaged in the field of turbines (fabrication of fixed and moving blades).

Other applications may relate in particular:

to insulators for microelectronics;

to solid electrolytes for high temperature fuel cells;

to mirrors for laser optics; and to alumina/zirconia composites (depositing matrix material on fibers, strands, fabrics).

The apparatus can be used in general in the surface coating and treatment industry. For example, mention may be made of its application to making cutting tools.

Naturally, and as can be seen from the above, the invention is not limited in any way to the particular applications and embodiments that have been considered more particularly; on the contrary, it extends to all variants.

We claim:

1. Apparatus for plasma activated chemical vapor deposition, the apparatus comprising:

a plurality of transformation means, each for transforming the state of a respective precursor of a deposition material to cause each of said respective precursors to pass from an initial state of matter to a gaseous state to provide a plurality of gaseous precursors;

a plurality of charging means, each for charging respective vector gas with a respective one of said plurality of gaseous precursors to form a plurality of precursor-charged gaseous mixtures;

a plurality of transfer means, each for transferring a respective one of said predetermined plurality of gaseous mixtures from a respective charging means to a plasma reactor having microwave excitation comprising a reaction enclosure, a microwave generator, and at least one waveguide interposed between said generator and the enclosure and providing non-resonant coupling; and injection means for injecting said plurality of gaseous mixtures into said reaction enclosure in the form of a jet of ionized gas;

each of said plurality of transfer means for transferring a respective one of said plurality of gaseous mixtures being independent of other of said plurality of transfer means, said injection means including a nozzle of frustoconical external profile, said nozzle having an inlet for receiving said plurality of gaseous mixtures from said plurality of transfer means and having at least one injection orifice outlet for injecting said jet of ionized gas into said reaction enclosure, said nozzle being shaped as a function of a desired configuration of said jet of ionized gas, said nozzle being fitted with heating means and with thermal insulation means.

2. Deposition apparatus according to claim 1, wherein each of said plurality of transformation means comprise at least one chamber and means for adjusting temperature and/or pressure within said chamber.

3. Deposition apparatus according to claim 1, wherein each of said plurality of charging means is adapted to pass a respective vector gas through a respective precursor in powder form.

4. Deposition apparatus according to claim 1, wherein a respective vector gas is inert relative to a respective precursor.

5. Deposition apparatus according to claim 1, wherein a respective vector gas is chemically reactive with a respective precursor.

6. Deposition apparatus according to claim 1, wherein at least one of said plurality of transfer means comprises a transfer tube that is heated and/or thermally insulated, and at least one stop valve that is heated and/or thermally insulated.

7. Deposition apparatus according to claim 1, wherein said nozzle includes a mixing chamber for mixing said plurality of gaseous mixtures, said mixing chamber being located upstream of said injection orifice outlet.

8. Deposition apparatus according to claim 1, wherein said nozzle is provided with a single outlet orifice.

9. Deposition apparatus according to claim 1, wherein said nozzle is provided with a multiplicity of outlet orifices defined by a subdivision means.

10. Deposition apparatus according to claim 9, wherein said subdivision means comprises a grid or trellis.

11. Deposition apparatus according to claim 9, wherein said subdivision means comprise a perforated plate.

* * * * *